(12) United States Patent
Sun et al.

(10) Patent No.: US 12,271,045 B2
(45) Date of Patent: Apr. 8, 2025

(54) REVERSE CLAMPING COMPRESSION DEVICE FOR CPO OR NPO

(71) Applicant: Celestica Technology Consultancy (Shanghai) Co. Ltd, Shanghai (CN)

(72) Inventors: Chao Sun, Shanghai (CN); Peng Xiao, Shanghai (CN)

(73) Assignee: Celestica Technology Consultancy (Shanghai) Co. Ltd, Shanghai (CN)

( * ) Notice: Subject to any disclaimer, the term of this patent is extended or adjusted under 35 U.S.C. 154(b) by 265 days.

(21) Appl. No.: 18/082,600

(22) Filed: Dec. 16, 2022

(65) Prior Publication Data

US 2024/0061196 A1    Feb. 22, 2024

(30) Foreign Application Priority Data

Aug. 17, 2022 (CN) .......................... 202210986412.1
Aug. 17, 2022 (CN) .......................... 202222170951.6

(51) Int. Cl.
| | |
|---|---|
| *G02B 6/43* | (2006.01) |
| *G02B 6/42* | (2006.01) |
| *H05K 7/10* | (2006.01) |
| *H05K 7/20* | (2006.01) |

(52) U.S. Cl.
CPC .............. *G02B 6/43* (2013.01); *G02B 6/428* (2013.01); *H05K 7/1007* (2013.01); *H05K 7/1092* (2013.01); *H05K 7/2039* (2013.01)

(58) Field of Classification Search
CPC ........ G02B 6/43; G02B 6/428; H05K 7/1007; H05K 7/1092; H05K 7/2039
USPC ............................................................ 385/14
See application file for complete search history.

(56) References Cited

U.S. PATENT DOCUMENTS

2022/0244465 A1\* 8/2022 Winzer ................ G02B 6/3869

\* cited by examiner

*Primary Examiner* — Jerry M Blevins
(74) *Attorney, Agent, or Firm* — IPRTOP LLC

(57) ABSTRACT

The present disclosure provides a reverse clamping compression device for CPO or NPO. The device includes a mechanical bolster placed on a main board, a compression cover covering optical modules, and a fastening connecting and fixing the compression cover to the mechanical bolster and protruding below the mechanical bolster. In the present disclosure, the compression cover above the optical modules is used to apply a compression force to the optical modules, and the spring element is placed in space below the main board, therefore, the space above the compression cover is not occupied, which can maximize the use of the space above the optical modules, greatly shorten the heat conduct path of the heat sink module, and ensure that the entire device is still assembled from top to bottom.

8 Claims, 3 Drawing Sheets

REVERSE CLAMPING COMPRESSION DEVICE FOR CPO OR NPO

CROSS REFERENCE TO RELATED APPLICATIONS

The present application claims the benefit of priority to Chinese Patent Application No. 202210986412.1, entitled "REVERSE CLAMPING COMPRESSION DEVICE FOR CPO OR NPO", filed with CNIPA on Aug. 17, 2022, and Chinese Patent Application No. 202222170951.6, entitled "REVERSE CLAMPING COMPRESSION DEVICE FOR CPO OR NPO", filed with CNIPA on Aug. 17, 2022, the contents of which are incorporated herein by reference in their entireties.

TECHNICAL FIELD

The present disclosure relates to the field of optoelectronic technology, in particular, to new applications of optoelectronic packaging.

BACKGROUND

An LGA socket of an optical module (OM) of Co-Packaged Optics (CPO) or Near Package Optics (NPO) requires a compression mechanism to provide a strong downward locking force from the top of the optical module to ensure that the optical module can be fully connected to the Land Grid Array (LGA) socket electrically. Optical modules and switch chips of CPO or NPO consume a lot of power, therefore, heatsink modules must be located as close as possible to the heat source to improve heat conduct efficiency. In addition, the whole assembly of CPO or NPO must be installed from top to bottom, and an assembly from an opposite direction is not acceptable.

SUMMARY

The present disclosure provides a reverse clamping compression device for CPO or NPO. The device includes a mechanical bolster mounted on a main board, a compression cover covering optical modules mounted on a mezzanine board, and a fastening connecting and fixing the compression cover to the mechanical bolster and protruding below the mechanical bolster.

In an embodiment of the present disclosure, one or more first connecting holes are arranged on the circumference of the compression cover for the fastening to be attached.

In an embodiment of the present disclosure, one or more second connecting holes are arranged on the circumference of the mechanical bolster for the fastening to be attached.

In an embodiment of the present disclosure, the fastening includes a floating standoff mounted on a top surface of the mechanical bolster, a spring element connected with the floating standoff and passing through the mechanical bolster and placed under the mechanical bolster, and a bolt passing through the compression cover and connecting to the floating standoff.

In an embodiment of the present disclosure, the spring element includes a spring bolt connected with the floating standoff and a compression spring sleeved on the spring bolt.

In an embodiment of the present disclosure, the bolt is a shoulder screw.

In an embodiment of the present disclosure, the compression cover includes several openings.

In an embodiment of the present disclosure, the position and the shape of each of the openings match with those of the corresponding optical modules.

In an embodiment of the present disclosure, each of the optical modules comprises an Integrated Heatsink (IHS) on a top, and the size of each of the openings matches with that of the IHS.

In an embodiment of the present disclosure, each of the optical modules is covered by the compression cover on shoulder of IHS.

As described above, the reverse clamping compression device for CPO or NPO of the present disclosure has the following beneficial effects.

In the present disclosure, the compression cover above the optical modules is used to apply compression force to the optical modules, and the spring elements are mounted in space below the main board, therefore, the space above the compression cover is not occupied, which can make heat sink modules maximize the use of the space above the optical modules, thus greatly reducing the heat conduct path of the heat sink modules, and ensuring that the entire device is still assembled from top to bottom.

DESCRIPTION OF REFERENCE NUMERALS

Figure 1:
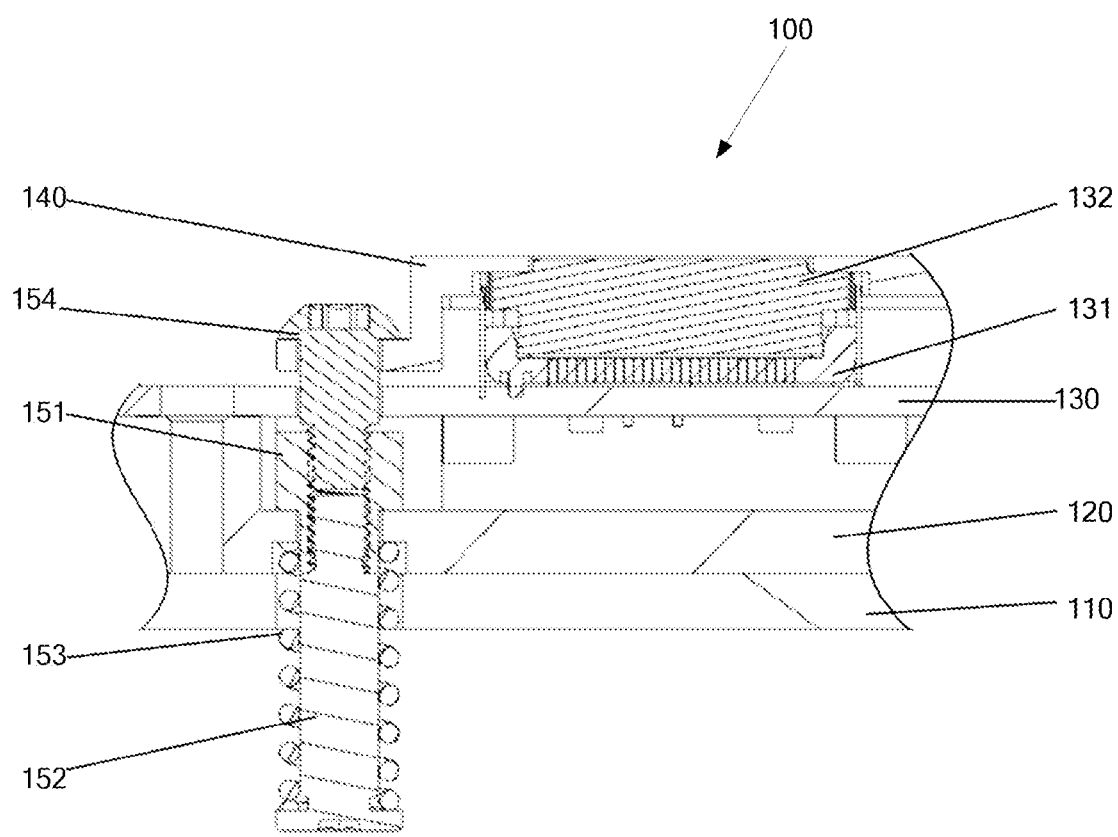
FIG. 1 shows a schematic structural diagram of a reverse clamping compression device for CPO or NPO according to the present disclosure.

100 Reverse clamping compression device for CPO or NPO
110 Main board
120 Mechanical Bolster
130 Mezzanine board
131 OM LGA socket
132 Optical Module
140 Compression cover
151 Floating standoff
152 Spring bolt
153 Compression spring
154 Shoulder screw

DETAILED DESCRIPTION

The embodiments of the present disclosure will be described below. Those skilled may easily understand other advantages and effects of the present disclosure according to the contents disclosed by the specification.

Figure 2:
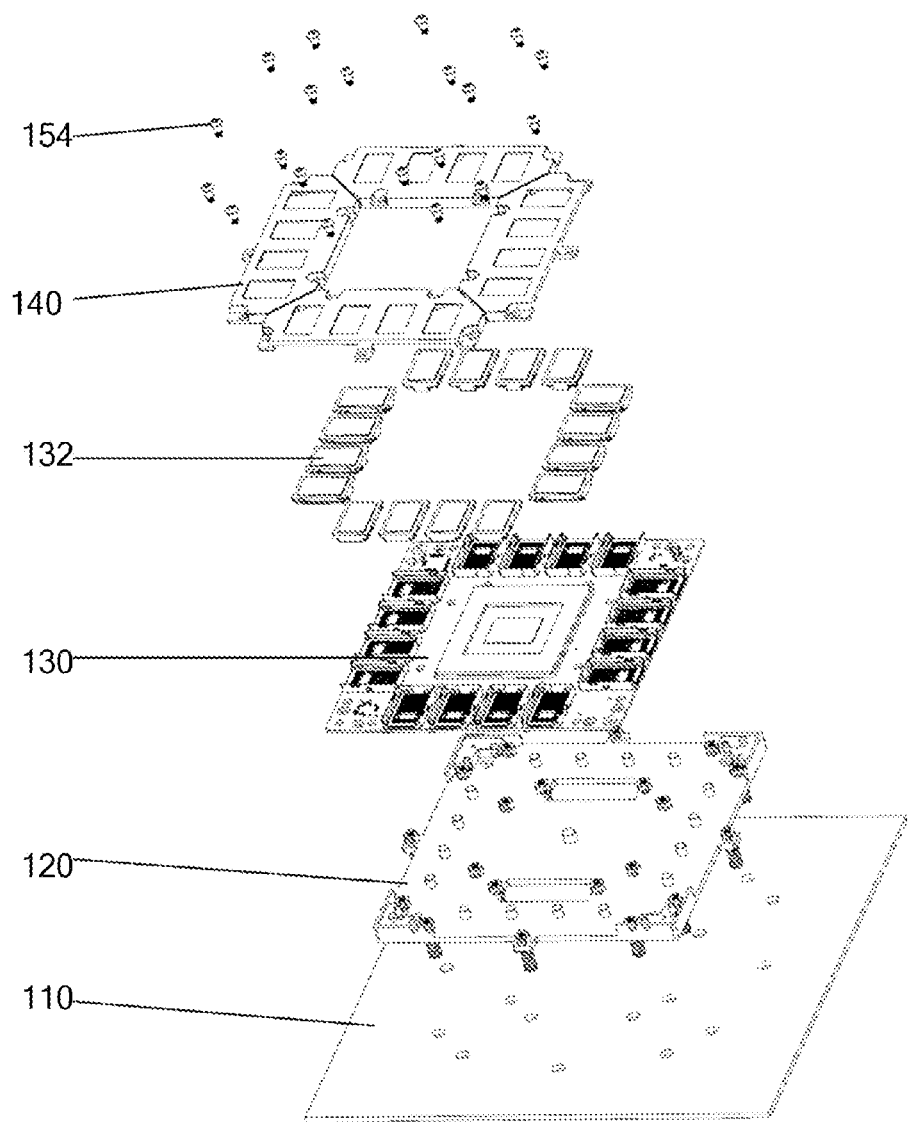
FIG. 2 shows a schematic exploded diagram of the reverse clamping compression device for CPO or NPO according to the present disclosure.
Figure 3:
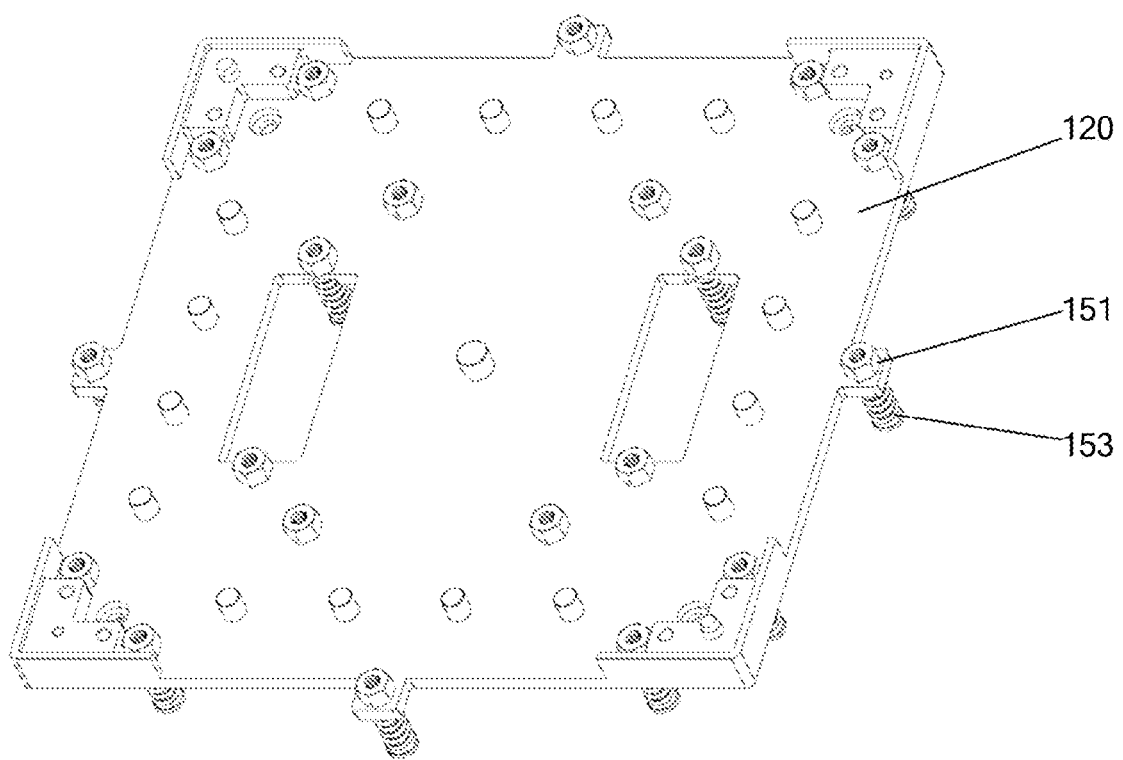
FIG. 3 shows a schematic structural diagram of a mechanical bolster of the reverse clamping compression device for CPO or NPO according to the present disclosure.

Please refer to FIGS. 1-3. It should be understood that the structures, proportions, sizes, and the like, which are illustrated in the drawings of the present specification, are used to clarify the contents disclosed in the specification for understanding and reading by those skilled, and are not intended to limit the implementation of the present disclosure, thus are not technically meaningful. Any modification of the structure, change of the scale, or adjustment of the size should still fall within the scope of the technical contents disclosed by the present disclosure without affecting the effects and achievable objectives of the present disclosure.

In the meantime, the terms "upper", "lower", "left", "right", "intermediate", "one", and the like as used in this specification are also for convenience of description, and are not intended to limit the scope of the present disclosure, and the change or adjustment of the relative relationship is considered to be within the scope of the present disclosure without substantial changes in technology.

An embodiment of the present disclosure provides a reverse clamping compression device for CPO or NPO to provide a clamping force for the assembly of CPO or NPO and to ensure the installation sequence.

The principle and implementation of the reverse clamping compression device for CPO or NPO of this embodiment will be described in detail below so that a person skilled in the art can understand the device.

As shown in FIG. 1, an embodiment provides a reverse clamping compression device 100 for CPO or NPO, the device includes a mechanical bolster 120, a compression cover 140, and a fastening.

The reverse clamping compression device 100 for CPO or NPO in this embodiment is described in detail below.

As shown in FIG. 2, in an embodiment, the compression cover 140, a mezzanine board 130, the mechanical bolster 120, and a main board 110 are assembled together from top to bottom.

The mechanical bolster 120 is the main component of the whole reverse clamping device, and the mechanical bolster 120 is mounted on the main board 110. The mezzanine board 130 is mounted on the mechanical bolster 120, and the mechanical bolster 120 provides support and fixation for the mezzanine board 130 above it. The mezzanine card 130 includes several LGA sockets 131, each of the sockets 131 is populated by an optical module 132.

In this embodiment, the compression cover 140 is mounted above the optical modules 132, and the compression cover 140 is fastened to the optical modules 132. The compression cover 140 is a purely mechanical passive part for applying a compression force to the optical modules 132.

Specifically, in this embodiment, one or more first connecting holes are arranged on the circumference of the compression cover 140 for the fastenings to be attached, and correspondingly, one or more second connecting holes are arranged on the circumference of the mechanical bolster 120 for the fastening to be attached. The compression cover 140 is connected to the mechanical bolster 120 by means of the fastening passing through the first connecting holes and the second connecting holes.

In this embodiment, the compression cover 140 includes a number of openings, and the position and shape of each of the openings match with those of the corresponding optical module 132.

In this embodiment, each of the optical modules 132 includes an IHS on a top of it, and the size of each of the openings matches the size of the IHS. Each of the optical modules 132 is covered by the compression cover 140 on a circumstance of the IHS.

In this embodiment, the fastening attaches and fixes the compression cover 140 to the mechanical bolster 120 and protrudes below the mechanical bolster 120.

Specifically, in this embodiment, the fastening includes a floating standoff 151 placed on the top surface of the mechanical bolster 120, an spring element connected with the floating standoff 151 and passing through the mechanical bolster 120 and placed under the mechanical base 120, and a fastening passing through the compression cover 140 and connecting to the floating standoff 151.

In this embodiment, the spring element includes a spring bolt 152 connected with the floating standoff 151 and a compression spring 153 sleeved on the spring bolt 152. The fastening is a shoulder screw 154.

In this embodiment, the shoulder screw 154 connects the compression cover 140 to the floating standoff 151 below, and the engagement stroke of the shoulder screw 154 controls the compression distance of the compression spring 153. The mechanical bolster 120 is the main part of the whole reverse clamping device, as shown in FIG. 3, the floating standoff 151 is mounted above the mechanical bolster 120, the spring bolt 152 is mounted below the mechanical bolster 120, and the floating standoff 151 is connected to the spring bolt 152 through the mechanical bolster 120. The above components are assembled from top to bottom.

The working principle of the reverse clamping compression device for CPO or NPO in this embodiment is as follows.

The mechanical bolster 120 is placed below the mezzanine board 130 of the CPO or NPO, and the mechanical bolster 120 includes features that provide support and fixation to the mezzanine board 130. Several floating standoffs 151 are employed for transmitting the compression force of the LGA sockets 131 to the optical modules 132, and each of the floating standoffs 151 is connected to a spring bolt 152 of a compression spring 153 placed below the mechanical bolster 120. The compression cover 140 is assembled above the optical modules 132, and several shoulder screws 154 passing through the compression cover 140 are connected to the corresponding floating standoffs 151 located under the mezzanine board 130.

When the shoulder screws 154 are tightened, the floating standoffs 151 are pulled upward, the spring bolts 152 under the floating standoffs 151 are then pulled upward, afterwards the compression springs 153 will be compressed, therefore, the spring bolts 152 generate a reaction force that, through the above connection, acts in the reverse direction on the compression cover 140, and then the reaction force is transmitted as the required clamping force to the optical modules 132 through the contact surfaces between the compression covers 140 and the optical modules 132.

Compared to conventional technology, the reverse clamping compression device 100 for CPO or NPO of this embodiment utilizes the mezzanine board 130 and the space below the main board 110 to place the compression springs 153, therefore, the compression spring 153 does not occupy the space above the compression cover 140, and the heat sink module can maximize the use of the space above the module and greatly shorten the heat conduct path of the heat sink module. Further, the compression cover 140 is connected to the compression spring 153 below by mechanical screws, which ensures that the whole device is still assembled from top to bottom.

In summary, in the present disclosure, the compression cover above the optical modules is used to apply the clamping force to the optical modules, and the spring elements are placed in space below the main board, therefore, the space above the compression cover is not occupied, which can maximize the use of the space above the optical modules, greatly shorten the heat conduct path of the heat sink module, and ensure that the entire device is still assembled from top to bottom. Therefore, the present disclosure effectively overcomes shortcomings in the existing technology and has high industrial utilization value.

The above-mentioned embodiments are just used for exemplarily describing the principle and effects of the present disclosure instead of limiting the present disclosure. Those skilled in the art can make modifications or changes to the above-mentioned embodiments without going against the spirit and the range of the present disclosure. Therefore, all equivalent modifications or changes made by those who have common knowledge in the art without departing from the spirit and technical concept disclosed by the present disclosure shall be still covered by the claims of the present disclosure.

What is claimed is:

1. A reverse clamping compression device for CPO or NPO, comprising:
    a mechanical bolster, placed on a main board;
    a compression cover covering optical modules mounted on a mezzanine board; and
    a fastening connecting and fixing the compression cover to the mechanical bolster and protruding below the mechanical bolster;
    wherein the fastening comprises a floating standoff placed on a top surface of the mechanical bolster, a spring element connected with the floating standoff and passing through the mechanical bolster and placed under the mechanical bolster and a bolt passing through the compression cover and connected to the floating standoff;
    wherein the spring element comprises a spring bolt connected with the floating standoff and a compression spring sleeved on the spring bolt.

2. The reverse clamping compression device for CPO or NPO according to claim 1, wherein one or more first connecting holes are arranged on the circumference of the compression cover for the fastening to be attached.

3. The reverse clamping compression device for CPO or NPO according to claim 2, wherein one or more second connecting holes are arranged on the circumference of the mechanical bolster for the fastening to be attached.

4. The reverse clamping compression device for CPO or NPO according to claim 1, wherein the bolt is a shoulder screw.

5. The reverse clamping compression device for CPO or NPO according to claim 1, wherein the compression cover includes a plurality of openings.

6. The reverse clamping compression device for CPO or NPO according to claim 5, wherein the position and shape of each of the plurality of openings match with those of the corresponding optical module.

7. The reverse clamping compression device for CPO or NPO according to claim 5, wherein each of the optical modules comprises an IHS on a top, and the size of each of the openings matches that of the IHS.

8. The reverse clamping compression device for CPO or NPO according to claim 7, wherein each of the optical modules is covered by the compression cover on a circumstance of the IHS.

\* \* \* \* \*